(12) United States Patent
Nakatsuka et al.

(10) Patent No.: US 10,304,895 B2
(45) Date of Patent: May 28, 2019

(54) METHOD FOR MANUFACTURING SOLID-STATE IMAGE PICKUP APPARATUS, SOLID-STATE IMAGE PICKUP APPARATUS, AND IMAGE PICKUP SYSTEM INCLUDING THE SAME

(71) Applicant: CANON KABUSHIKI KAISHA, Tokyo (JP)

(72) Inventors: Shunsuke Nakatsuka, Oita (JP); Kentaro Suzuki, Kawasaki (JP); Mari Isobe, Kawasaki (JP); Masatsugu Itahashi, Yokohama (JP); Yasuhiro Sekine, Yokohama (JP); Sho Suzuki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/833,831

(22) Filed: Dec. 6, 2017

(65) Prior Publication Data

US 2018/0097032 A1    Apr. 5, 2018

Related U.S. Application Data

(63) Continuation of application No. 15/146,728, filed on May 4, 2016, now Pat. No. 9,899,445.

(30) Foreign Application Priority Data

May 19, 2015    (JP) .................................. 2015-101704
Dec. 1, 2015     (JP) .................................. 2015-235242

(51) Int. Cl.
*H04N 5/374*       (2011.01)
*H01L 27/146*      (2006.01)

(52) U.S. Cl.
CPC .... *H01L 27/14643* (2013.01); *H01L 27/1461* (2013.01); *H01L 27/14603* (2013.01);
(Continued)

(58) Field of Classification Search
CPC .......... H01L 27/14603; H01L 27/1461; H01L 27/14612; H01L 27/14623; H01L 27/1463;
(Continued)

(56) References Cited

U.S. PATENT DOCUMENTS 6,583,472 B1 *   6/2003   Shibata ............... G02F 1/13454
                                                                 257/350
8,405,800 B2 *   3/2013   Ishitani ............. G02F 1/133528
                                                                 349/117
(Continued)

FOREIGN PATENT DOCUMENTS

CN         1619828 A      5/2005
CN       101276830 A     10/2008
(Continued)

*Primary Examiner* — Amy R Hsu
(74) *Attorney, Agent, or Firm* — Canon U.S.A., Inc. IP Division

(57) ABSTRACT

A method for manufacturing a solid-state image pickup apparatus includes forming a first insulating film over a substrate after forming a gate electrode of a first transfer transistor and a gate electrode of a second transfer transistor, forming a second insulating film on the first insulating film, forming a first structure and a second structure on side surfaces of the gate electrodes of the first and second transfer transistors, respectively, via the first insulating film by etching the second insulating film in such a manner that the first insulating film remains on a semiconductor region of a photoelectric conversion unit and a semiconductor region of a charge holding unit, and forming a light shielding film that covers the gate electrode of the first transfer transistor, the semiconductor region of the charge holding unit, and the gate electrode of the second transfer transistor.

13 Claims, 12 Drawing Sheets

(52) U.S. Cl.
CPC .. *H01L 27/14612* (2013.01); *H01L 27/14623* (2013.01); *H01L 27/14685* (2013.01); *H01L 27/14689* (2013.01); H01L 27/1463 (2013.01); H04N 5/374 (2013.01)

(58) Field of Classification Search
CPC ......... H01L 27/14643; H01L 27/14685; H01L 27/14689; H04N 5/374
See application file for complete search history.

(56) References Cited

U.S. PATENT DOCUMENTS

| | | | |
|---|---|---|---|
| 8,681,281 B2* | 3/2014 | Liu | G02F 1/13452 349/149 |
| 2004/0051124 A1 | 3/2004 | Kawasaki | |
| 2006/0003519 A1 | 1/2006 | Jang | |
| 2006/0121640 A1 | 6/2006 | Kim | |
| 2006/0231898 A1* | 10/2006 | Jeong | H01L 27/14623 257/359 |
| 2008/0142856 A1 | 6/2008 | Sato et al. | |
| 2009/0008688 A1 | 1/2009 | Park et al. | |
| 2012/0139070 A1* | 6/2012 | Kobayashi | H01L 27/14625 257/431 |
| 2012/0299066 A1 | 11/2012 | Kato et al. | |
| 2013/0222657 A1* | 8/2013 | Shimotsusa | H01L 27/14601 348/294 |
| 2014/0091378 A1 | 4/2014 | Hashimoto | |
| 2015/0145092 A1* | 5/2015 | Itagaki | H01L 27/14689 257/446 |
| 2016/0163764 A1* | 6/2016 | Yamaguchi | H01L 27/14698 438/60 |

FOREIGN PATENT DOCUMENTS

| | | | |
|---|---|---|---|
| CN | 102376726 A | 3/2012 | |
| CN | 102468314 A | 5/2012 | |
| CN | 102547168 A | 7/2012 | |
| CN | 102668080 A | 9/2012 | |
| CN | 103165632 A | 6/2013 | |
| CN | 103545330 A | 1/2014 | |
| CN | 104183610 A | 12/2014 | |
| JP | 09219394 A * | 8/1997 | |
| JP | H09219394 A | 8/1997 | |
| JP | 2014022421 A * | 2/2014 | ....... H01L 27/14818 |
| JP | 2014022421 A | 2/2014 | |
| KR | 1020060077711 A | 7/2006 | |

* cited by examiner

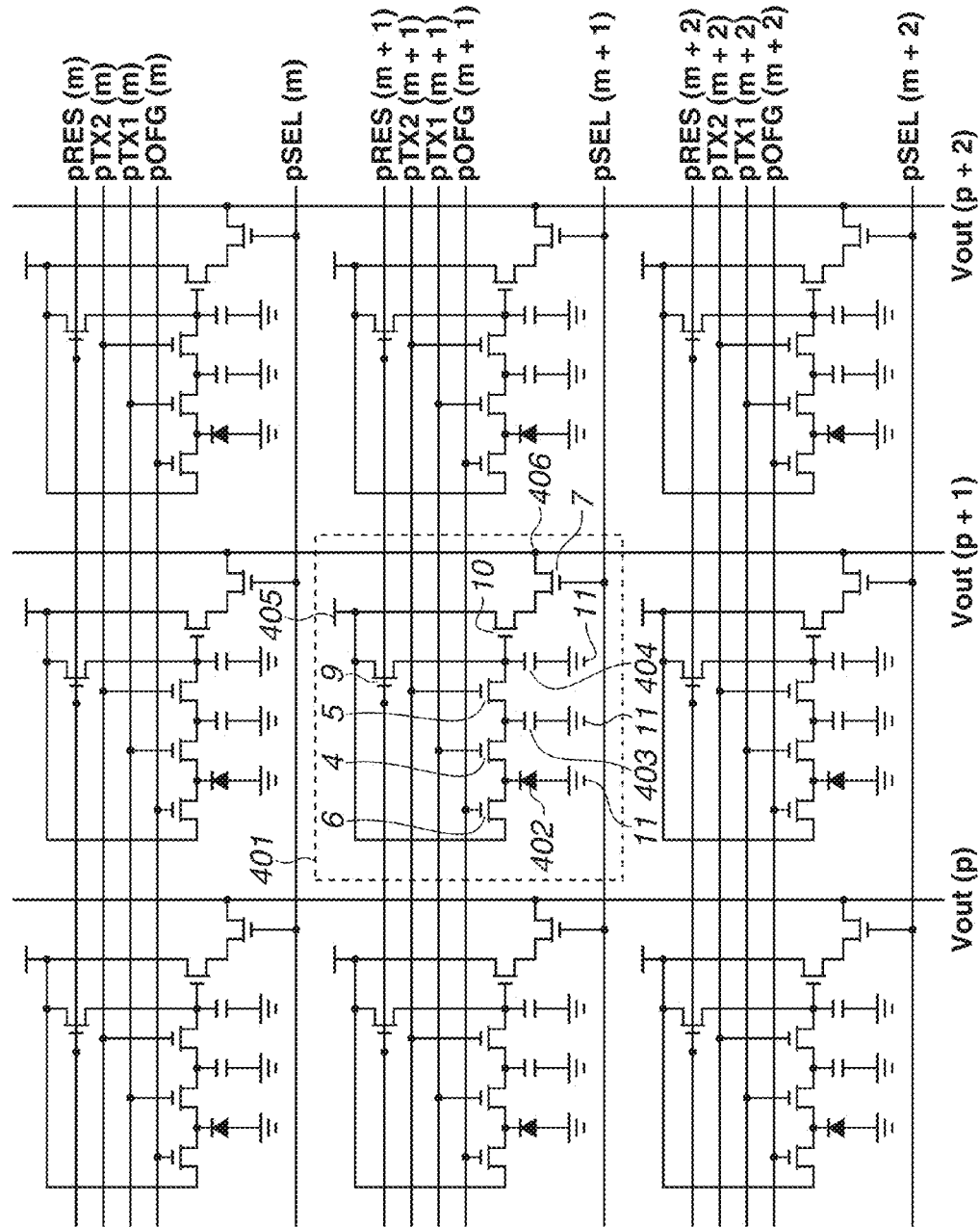

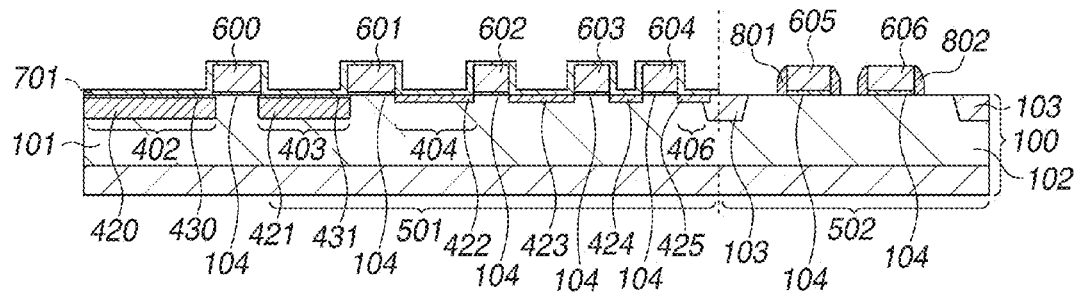
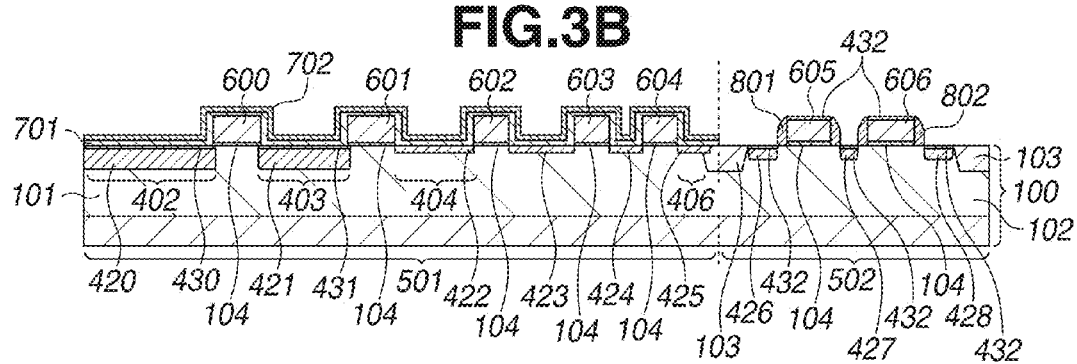
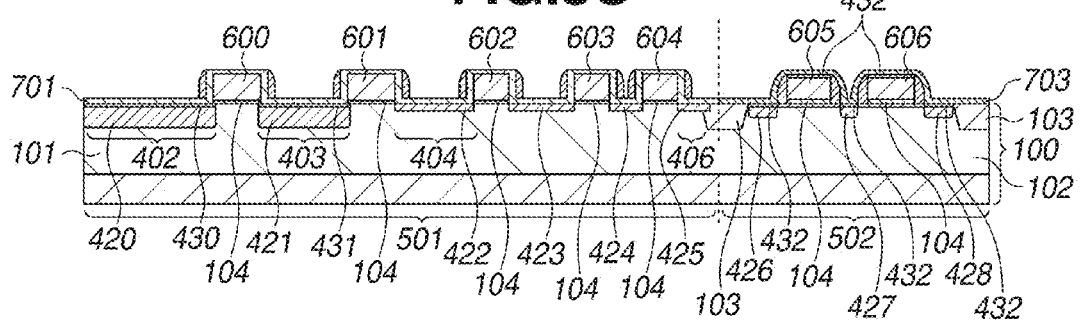
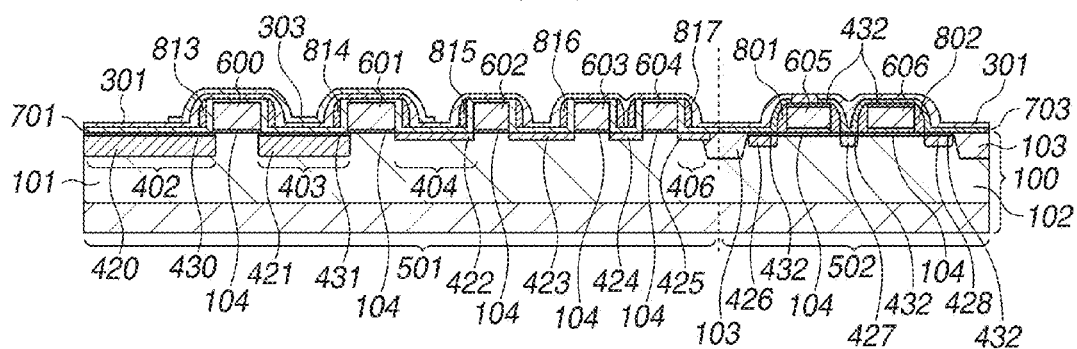

METHOD FOR MANUFACTURING SOLID-STATE IMAGE PICKUP APPARATUS, SOLID-STATE IMAGE PICKUP APPARATUS, AND IMAGE PICKUP SYSTEM INCLUDING THE SAME

CROSS-REFERENCE TO RELATED APPLICATION

This application is a Continuation of U.S. application Ser. No. 15/146,728, filed May 4, 2016, which claims priority from Japanese Patent Applications No. 2015-101704, filed May 19, 2015, and No. 2015-235242, filed Dec. 1, 2015, which are hereby incorporated by reference herein in their entirety.

BACKGROUND OF THE INVENTION

Field of the Invention

The present invention relates to a method for manufacturing a solid-state image pickup apparatus, the solid-state image pickup apparatus, and an image pickup system including the solid-state image pickup apparatus.

Description of the Related Art

In recent years, a configuration equipped with a global electronic shutter function has been proposed for active-pixel solid-state image pickup apparatuses represented by complementary metal-oxide semiconductor (CMOS) image sensors.

Such a solid-state image pickup apparatus equipped with the global electronic shutter function includes a light receiving unit that carries out photoelectric conversion, and a charge holding unit that holds a charge generated from the photoelectric conversion at the light receiving unit. At this time, if light is incident on the charge holding unit and the photoelectric conversion is carried out there, a noise signal may occur, leading to deterioration of an image quality. Therefore, the charge holding unit should be covered with a light shielding film to prevent the light from being incident thereon.

The solid-state image pickup apparatus having the light shielding structure includes an optically transparent insulating film between a substrate and the light shielding film, whereby a light shielding performance is improved by preventing the light from entering from this insulating film. Japanese Patent Application Laid-Open No. 2014-22421 discusses improving coatability of the light shielding film on a side portion of a gate electrode by forming the light shielding film after forming the gate electrode and the side wall.

On the solid-state image pickup apparatus including a transistor with the side wall formed below the light-shielding film on a pixel unit, an exposed semiconductor region may be damaged by etching when the side wall is formed after the gate electrode is formed.

SUMMARY OF THE INVENTION

According to an aspect of the present invention, a method for manufacturing a solid-state image pickup apparatus includes forming a first semiconductor region of a photoelectric conversion unit and a second semiconductor region of a charge holding unit in a substrate, forming a first gate electrode of a first transistor configured to transfer a charge in the first semiconductor region to the charge holding unit and a second gate electrode of a second transistor configured to transfer the charge from the second semiconductor region on the substrate, forming a first structure on a first side surface of the first gate electrode so that the first insulating film is between the first gate electrode and the first structure, by etching the second insulating film while the first insulating film remains on the first semiconductor region and the second semiconductor region, the first side surface of the first gate electrode being on a side where the photoelectric conversion unit is provided, and a second side surface of the first gate electrode being on a side where the charge holding unit is provided; and forming a light shielding film along the first structure, on a region which extends from a region over the first gate electrode to a region over the first semiconductor region by forming a film after forming the first structure, and by etching a part of the film. A cross-sectional shape of a top part of the first structure in a first direction from the photoelectric conversion unit to the charge holding unit has a surface where a distance between the surface of the top part and the first side surface of the first gate electrode decreases in a second direction from a bottom of the first structure to a top of the first structure. A distance between the first semiconductor region and an end of the light shielding film that is over the first semiconductor region is smaller than a distance between a top surface of the first gate electrode and the substrate.

Further, according to another aspect of the present invention, a solid-state image pickup apparatus includes a photoelectric conversion unit including a first semiconductor region, a first transistor configured to transfer a charge in the first semiconductor region, a charge holding unit including a second semiconductor region configured to hold the charge transferred from the first transistor, a second transistor configured to transfer the charge in the second semiconductor region, a first insulating film covering the first semiconductor region, a first gate electrode of the first transistor, the second semiconductor region, and a second gate electrode of the second transistor, a first structure provided on a first side surface of the first gate electrode with the first insulating film interposed between the first gate electrode and the first structure, the first side surface being on a side where the photoelectric conversion unit is provided, and a second surface of the first gate electrode being on a side where the charge holding unit is provided, and a light shielding film provided along the first structure, on a region which extends from a region over the first gate electrode to a region over the first semiconductor region. A cross-sectional shape of a top part of the first structure in a first direction from the photoelectric conversion unit to the charge holding unit has a surface where a distance between the surface of the top part and the first side surface of the first gate electrode decreases in a second direction from a bottom of the first structure to a top of the first structure. A distance between the first semiconductor region and an end of the light shielding film that is over the first semiconductor region is smaller than a distance between a top surface of the first gate electrode and the substrate.

Furthermore, according to yet another aspect of the present invention, a solid-state image pickup apparatus includes a photoelectric conversion unit including a first semiconductor region, a first transistor configured to transfer a charge in the first semiconductor region, a charge holding unit including a second semiconductor region configured to hold the charge transferred from the first transistor, a second transistor configured to transfer the charge in the second semiconductor region, a floating diffusion unit configured such that the charge in the second semiconductor region is transferred to the floating diffusion unit, a first insulating film covering the first semiconductor region, a first gate electrode of the first transistor, the second semiconductor region, and a second gate electrode of the second transistor, a second structure provided on a first side surface of the second gate electrode with the first insulating film interposed between the second gate electrode and the second structure, the first side surface of the second gate electrode being on a side where the charge holding unit is provided, and a second surface of the second gate electrode being on a side where the floating diffusion unit is provided, and a light shielding film provided along the second structure, on a region which extends from a region over the second semiconductor region to a region over the second gate electrode. A cross-sectional shape of a top part of the second structure in a third direction from the charge holding unit to the floating diffusion unit has a surface where a distance between the surface of the cross-sectional shape and the first side surface of the second gate electrode decreases in a fourth direction from a bottom of the second structure to a top of the second structure. A distance between the second semiconductor region and a part of the light shielding film, the part being over the first semiconductor region, is smaller than a distance between a top surface of the second gate electrode and the substrate.

Further features of the present invention will become apparent from the following description of exemplary embodiments with reference to the attached drawings.

BRIEF DESCRIPTION OF THE DRAWINGS

FIG. 1A is an equivalent circuit diagram of a part of a solid-state image pickup apparatus according to first, second, and third exemplary embodiments.

FIGS. 3A, 3B, 3C, and 3D are schematic cross-sectional views of the part of the solid-state image pickup apparatus according to the first exemplary embodiment.

DESCRIPTION OF THE EMBODIMENTS

Figure 1B:
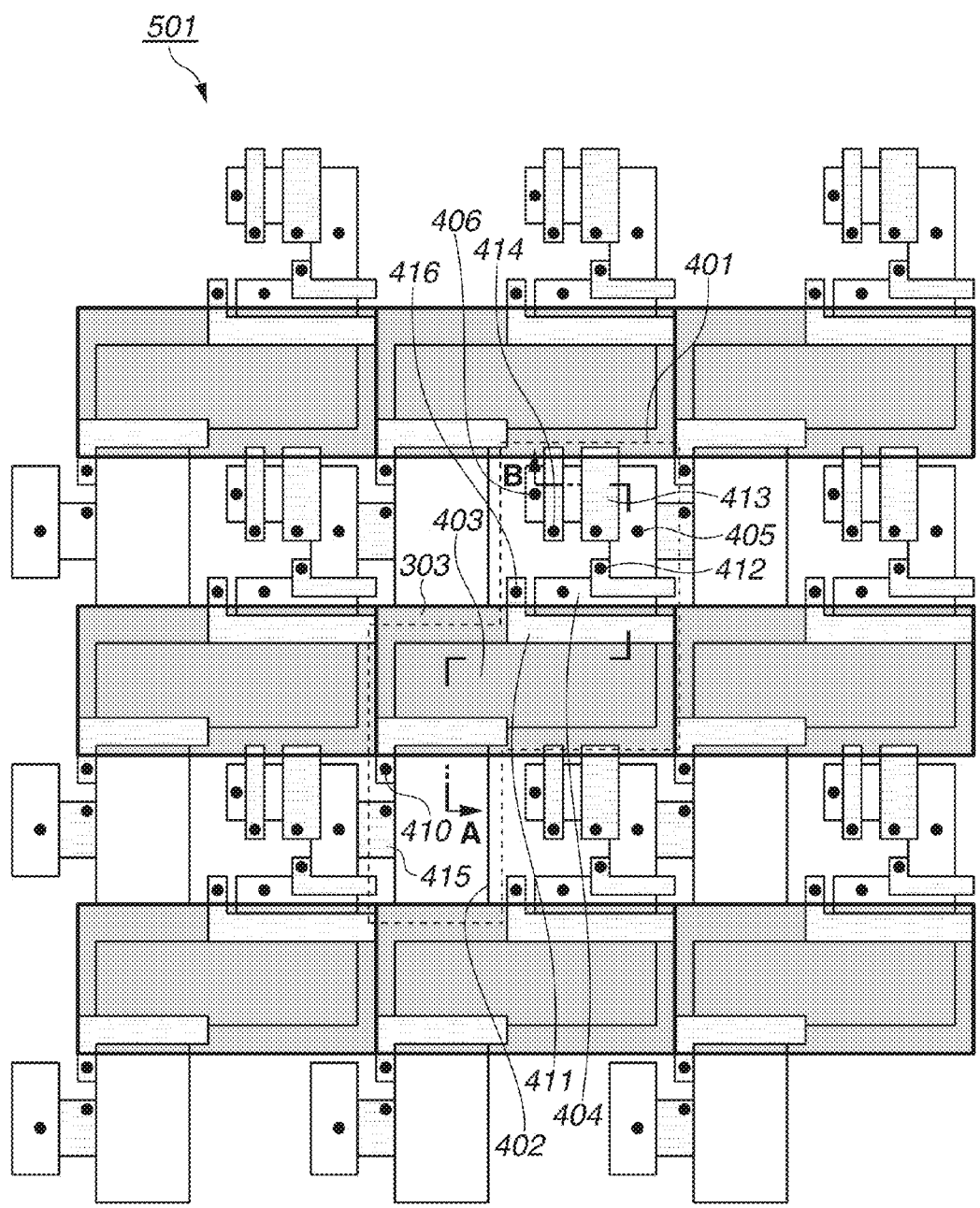
FIG. 1B is a schematic plan view of the part of the solid-state image pickup apparatus according to the first, second, and third exemplary embodiments.

If a member is described as being disposed "over" or "on" another member or a substrate in the present disclosure, this member may be disposed immediately on the other member or the substrate or may be disposed on the other member or the substrate with further another or other member (s) interposed therebetween. If a member is described as being disposed "immediately on" another member, this member is disposed so as to be placed on the other member and also in contact with the other member. Also, if a member is described as being disposed "over" another member, in the present disclosure, this member may be disposed in a manner such that the member is overlapped with at least a part of the other member in a planer view.

In the present disclosure, assume that a same reference numeral indicates identical or corresponding members, or members having identical or corresponding functions.

In the following description, exemplary embodiments for embodying the present invention will be described with reference to the drawings.

FIG. 1A is an equivalent circuit diagram of a part of a solid-state image pickup apparatus according to a first exemplary embodiment of the present invention, and FIG. 1B is a schematic plan view of the part of the solid-state image pickup apparatus according to the present exemplary embodiment. In this example, FIGS. 1A and 1B illustrate a configuration in which pixels 401 each including a charge holding unit are arrayed in three rows and three columns as a part of a pixel unit 501.

The pixel unit 501 includes a light shielding film 303, a photoelectric conversion unit 402 that is a light receiving unit, a charge holding unit 403, a floating diffusion unit 404 (hereinafter referred to as an FD unit), a power source unit 405, and a pixel output unit 406. Further, as illustrated in FIG. 1A, the pixel unit 501 includes a first transfer transistor 4 that transfers a charge in the photoelectric conversion unit 402, a second transfer transistor 5 that transfers the charge from the charge holding unit 403, and a reset transistor 9 that resets the charge in the FD unit. Furthermore, the pixel unit 501 includes an amplification transistor 10, a selection transistor 7, and a transistor 6 for an overflow drain (hereinafter referred to as an OFD) that works as a unit from which the charge is discharged.

Figure 2A:
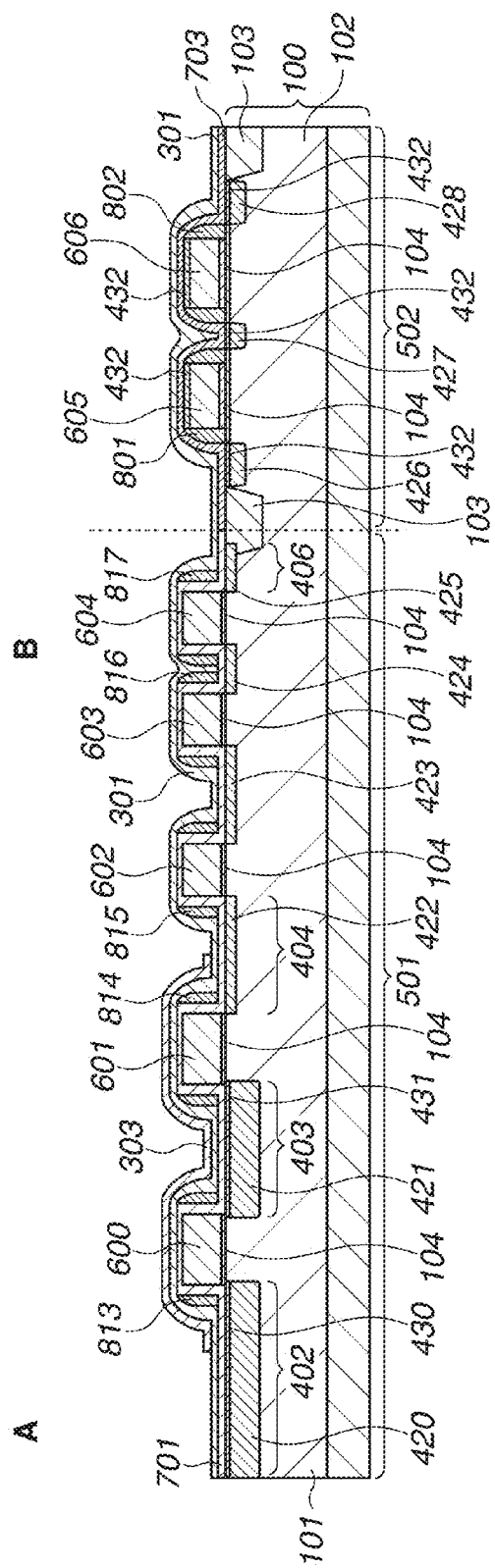
FIG. 2A is a schematic cross-sectional view of the part of the solid-state image pickup apparatus according to the first exemplary embodiment.

FIG. 2A is a schematic cross-sectional view of the part of the solid-state image pickup apparatus illustrated in FIG. 1B, and illustrates a cross-section of a portion of the pixel unit 501 that is indicated by A-B in FIG. 1B and a cross-section of arbitrary transistors of a peripheral circuit unit 502. A substrate 100 is a semiconductor substrate, and includes wells 101 and 102 and element separation portions 103.

The first transfer transistor 4 includes a gate electrode 600. The second transfer transistor 5 includes a gate electrode 601. The reset transistor 9 includes a gate electrode 602. Further, the amplification transistor 10 includes a gate electrode 603. The selection transistor 7 includes a gate electrode 604. The transistor 6 for the OFD includes a gate electrode 415. FIG. 1B illustrates a plan view of them. A negative type (N-type) semiconductor region 420 constituting the photoelectric conversion unit 402, an N-type semiconductor region 421 constituting the charge holding unit 403, and an N-type semiconductor region 422 constituting the FD unit 404 are formed in the well 101 of the pixel unit 501. Further, positive type (P-type) semiconductor regions 430 and 431, which function as surface protective layers, are formed on the N-type semiconductor regions 420 and 421, respectively. Besides them, N-type semiconductor regions 423 and 424, which function as a source and a drain of the transistor of the pixel unit 501, and an N-type semiconductor region 425 constituting the pixel output unit 406 are provided in the well 101 of the pixel unit 501. The first transistor 4 transfers the charge in the N-type semiconductor region 420 and the N-type semiconductor region 420 is configured to hold the transferred charge. The second transistor 5 transfers the charge in N-type semiconductor region 421 to the FD unit 404.

Semiconductor regions 426, 427, and 428, which function as sources and drains of the transistors of the peripheral circuit unit 502, are formed in the well 102 of the peripheral circuit unit 502. A silicide layer 432 is formed on the sources, the drains, and gate electrodes of the transistors of the peripheral circuit unit 502 to reduce resistance of a connection portion of a contact plug. The silicide layer 432 can be formed with use of a film of silicide, such as cobalt silicide, titanium silicide, or nickel silicide.

As viewed in a planer view, the gate electrode 600 of the first transfer transistor 4 and the gate electrode 601 of the second transfer transistor 5 are formed adjacently to the photoelectric conversion unit 402 and the charge holding unit 403, respectively. Further, the gate electrode 602 of the reset transistor 9, the gate electrode 603 of the amplification transistor 10, and the gate electrode 604 of the selection transistor 7 are provided on the well 101. Gate electrodes 605 and 606 of the transistors of the peripheral circuit unit are provided on the well 102.

If an insulating layer is formed on the gate electrodes 600 and 601, and a light shielding film is formed on that, a film thickness of the light shielding film may be thinned locally at ends of the gate electrodes 600 and 601, so that a light shielding performance may be deteriorated. With the deterioration of the light shielding performance, for example, the photoelectric conversion may be caused by light with which the charge holding unit 403 is illuminated, so that a noise signal may be generated.

Therefore, the present exemplary embodiment is provided with a structure configured in such a manner that at least a side surface of an upper portion thereof is a curved surface and a center of curvature of the curved surface is located on one side that is closer to the gate electrode 600, on a side surface of the gate electrode 600 to prevent or reduce the thinning of the film thickness of the light shielding film. Similarly, the present exemplary embodiment is provided with a structure configured in such a manner that at least a side surface of an upper portion thereof is a curved surface and a center of curvature of the curved surface is located on one side that is closer to the gate electrode 601, on a side surface of the gate electrode 601. This provision suppresses the undulation of a surface of a target to be covered with the light-shielding film that faces the light shielding film (in the present example, surfaces defined by connecting upper surfaces of the gate electrodes 600 and 601 and side surfaces of structures 813 and 814, respectively), and therefore can prevent or reduce the thinning of the film thickness of the light shielding film.

Such structures can be formed by, for example, depositing a film on the gate electrodes 600 and 601 and performing dry etching on this film, similarly to side wall spacers provided on side surfaces of the gate electrodes 605 and 606 of the transistors in the peripheral circuit unit 502.

On the other hand, etching the film to form the structures may inflict damage on the semiconductor regions 420 and 430 of the photoelectric conversion unit 402 and the semiconductor regions 421 and 431 of the charge holding unit 403. Therefore, an insulating film is formed on the semiconductor regions 420 and 430 of the photoelectric conversion unit 402 and the semiconductor regions 421 and 431 of the charge holding unit 403 after the gate electrodes 600 and 601 are formed and before the structures are formed, to reduce the damage from the etching. This arrangement allows the semiconductor regions 420 and 430 of the photoelectric conversion unit 402 and the semiconductor regions 421 and 431 of the charge holding unit 403 to be covered with the insulating film during the etching for forming the structures, and therefore can prevent or reduce the occurrence of the damage on these semiconductor regions 420 and 430, and 421 and 431.

A specific example of a configuration of the image pickup apparatus having the above-described characteristic will be described with reference to FIG. 2A. An insulating film 701 is formed on the pixel unit 501 so as to cover the gate electrodes 600 to 604. The structures 813 and 814, and structures 815, 816, and 817 are provided on the side surfaces of the gate electrodes 600 and 601, and side surfaces of the gate electrodes 602, 603, and 604, respectively, via the insulating film 701.

The structures 813, 814, 815, 816, and 817 are each configured in such a manner that a cross-sectional shape of a top part of each of the structures 813, 814, 815, 816, and 817, in a channel length direction of the corresponding transistor, has a surface where a distance between the surface of the top part and the side surface of the corresponding gate electrode decreases in a direction from a bottom of the structure to the top of the structure. For instance, the structures 813, 814, 815, 816, and 817 are each configured in such a manner that at least a side surface of an upper portion thereof is a curved surface, and a center of curvature of the curved surface is located on one side that is closer to the corresponding gate electrode 600, 601, 602, 603, or 604. Specifically, the structures 813, 814, 815, 816, and 817 each have an upper portion shaped as a curved surface convex outwardly (toward an opposite side from the corresponding gate electrode 600, 601, 602, 603, or 604).

Therefore, the provision of the structures 813 to 817 on the side surfaces of the gate electrodes 600 to 604 can make gentle differences in level between the gate electrodes 600 to 604 and the substrate 100, thereby preventing or reducing the local thinning of the film thickness of the light shielding film formed thereon.

The structure 813, which is provided on a first side of the gate electrode 600, the first side being a side on which the photoelectric conversion unit is provided, is described. The gate electrode 600 (first gate electrode) has the first side surface and the second side surface. The first side surface is on a side on which the photoelectric conversion unit is provided, and a second side surface is on a side on which the charge holding unit is provided. The structure 813 is configured in such a manner that a cross-sectional shape of the top part of the structure 813, in a first direction from the photoelectric conversion unit to the charge holding unit, has a surface where a distance between the surface of the top part and the first side surface of the gate electrode 600 decreases in a second direction from a bottom of the structure 813 to the top of the structure 813. Further, the structure 814 which is provided on a first side of the gate electrode 601, the first side being a side on which the charge holding unit is provided, is described. The gate electrode 601 (second gate electrode) has the first side surface and the second side surface. The first side surface is on a side on which the charge holding unit is provided, and the second side surface is on a side on which the FD unit is provided. The structure 813 is configured in such a manner that a cross-sectional shape of the top part of the structure 814, in a third direction from the charge holding unit to the FD unit, has a surface where a distance between the surface of the top part and the first side surface of the gate electrode 601 decreases in a fourth direction from a bottom of the structure 814 to the top of the structure 814.

Here, the example where a cross-sectional shape of the top part of each of the structures 813, 814, 815, 816, and 817 has a curved surface is described. However, the structures 813, 814, 815, 816, and 817 are not limited to this structure. Each of the structures 813, 814, 815, 816, and 817 may have a flat surface as long as the cross-sectional shape of the top part of each of the structures 813, 814, 815, 816, and 817, in the channel length direction of the corresponding transistor has the surface where the distance between the surface of the top part and the side surface of the corresponding gate electrode decreases in the direction from the bottom to the top of the structure, which can make gentle differences in level between the gate electrodes 600 to 604 and the substrate 100, thereby preventing or reducing the local thinning of the film thickness of the light shielding film formed thereon.

In the present example, the insulating film 701 is disposed between the gate electrodes 600 to 604 and the structures 813 to 817, but even in this case, the provision of the structures 813 to 817 makes gentle differences in level, and therefore can acquire an effect of reducing the local thinning of the film thickness of the light shielding film.

Further, the insulating film 701 on the photoelectric conversion unit 402 also functions as an antireflection film. Therefore, it is desirable to select a material and a film thickness of the insulating film 701 in consideration of a refractive index or refractive indices of the substrate 100, an insulating film formed on the insulating film 701, and/or the like. In the present example, the insulating film 701 can be made of a nitride film or a layer stack of an oxide film and a nitride film. For example, the insulating film 701 can be made of a film including silicon nitride as a main component thereof, or a layer stack of a film including silicon oxide as a main component thereof and a film including silicon nitride as a main component thereof.

The structures 813 to 817 can be formed by depositing an oxide film, such as a film including silicon oxide as a main component thereof, on the substrate 100 so as to cover the gate electrodes 600 to 604 as an insulating film 702 (shown in FIG. 3B), and then etching the deposited oxide film.

In the peripheral circuit unit 502, structures 801 and 802 are provided on each side surfaces of the gate electrodes 605 and 606, respectively. Each of the structures 801 and 802 is configured in such a manner that a cross-sectional shape of a top part of each of the structures 801 and 802, in a channel length direction of the corresponding transistor, has a surface where a distance between the surface of the top part and the side surface of the corresponding gate electrode decreases in a direction from a bottom of the structure to the top of the structure. For instance, the structure 801 and 802, which are each configured in such a manner that at least a side surface of an upper portion thereof is a curved surface and a center of curvature of the curved surface is located on one side that is closer to the corresponding gate electrode 605 or 606, are provided on side surfaces of the gate electrodes 605 and 606, respectively, in the peripheral circuit unit 502. The structures 801 and 802 are formed from the insulating film 701, whereby the structures 801 and 802, and the insulating film 701 include the same main component.

Further, an insulating film 703 is formed on the substrate 100 so as to cover the gate electrodes 605 and 606 and the structures 801 and 802 in the peripheral circuit unit 502. The insulating film 703 can be made of a nitride film, or a layer stack of an oxide film and a nitride film. For example, the insulating film 703 can be made of a film including silicon nitride as a main component thereof, or a layer stack of a layer including silicon oxide as a main component thereof and a layer including silicon nitride as a main component thereof.

The insulating film 703 functions as a diffusion prevention layer that prevents diffusion of metallic elements forming silicide, such as cobalt, titanium, or nickel, from the silicide layer 432. Therefore, the use of the silicon nitride film, which is denser than the silicon oxide film, or the layered structure including this silicon nitride film can further reduce the diffusion of the metal.

Further, an insulating film 301 is provided on the insulating film 701 and the structures 813 to 817 of the pixel unit 501, and the insulating film 703 of the peripheral circuit unit 502. The provision of the insulating film 301 can make the gentler differences in level. The insulating film 301 can be made of an oxide film, such as a film including silicon oxide as a main component thereof. The present example indicates an example including the insulating film 301, but the solid-state image pickup apparatus may be configured not to include the insulating film 301 because the structures 813 and 814 already provide the gentle differences in level between the gate electrodes 600 and 601 and the substrate 100.

The light shielding film 303 is formed on the insulating film 301 so as to cover the gate electrode 600 of the first transfer transistor 4, the semiconductor regions 421 and 431 of the charge holding unit 403, and the gate electrode 601 of the second transfer transistor 5. The light shielding film 303 can be formed by depositing a film of a material having a high light shielding property, such as a tungsten film, and etching the deposited film to remove an unnecessary portion, such as a portion formed on the photoelectric conversion unit 402 and a portion where a contact is formed.

In other words, the film that will become the light shielding film 303 is etched in such a manner that at least the portion formed on the photoelectric conversion unit 402 is partially removed so as not to prevent the light from being incident thereon. Therefore, the light shielding film 303 is provided along the structure 813 on a region which extends from a region over the gate electrode 600 to a region over the first semiconductor region 420. Further, in a planar view (as viewed from a direction along a film thickness of a gate insulating film 104), the light shielding film 303 is provided on a region overlapping at least the gate electrode 600, the semiconductor regions 421 and 431 of the above-described charge holding unit 403, and the gate electrode 601 to prevent or reduce the photoelectric conversion at the charge holding unit 403. That is, the light shielding film 303 is also provided on a region over the gate electrode 600 to a region over the gate electrode 601, and provided along the structure 814 on a region which extends from a region over the second semiconductor region 421 to a region over the gate electrode 612.

It is desirable that a distance from the semiconductor regions 421 and 431 of the charge holding unit 403 to the light shielding film 303 is short to prevent or reduce the entry of the unnecessary light onto the charge holding unit 403. Therefore, if the solid-state image pickup apparatus is configured to include the insulating film 301 between the gate electrodes 600 and 601 and the structures 813 and 814, and the light shielding film 303, a film thickness of the insulating film 301 is set to a thinner thickness than a so-called planarizing film, which has a flat upper surface with them embedded therein. More specifically, it is desirable that the film thickness of the insulating film 301 is thinner than film thicknesses of the gate electrodes 600 and 601.

Accordingly, the light shielding film 303 is provided so as to at least partially cover the side surfaces of the gate electrodes 600 and 601. In other words, the light shielding film 303 extends from tops of the gate electrodes 600 and 601 to the side surfaces beyond the ends of the gate electrodes 600 and 601. It is desirable, from the viewpoint of the light shielding performance, that an end of the light shielding film 303 is located at a position closer to the substrate 100 than an upper end of the gate electrode 600 or 601 in a direction in parallel with the side surface of the gate electrode 600 or 601 (a direction perpendicular to a planer view in which a light receiving surface is set as a main surface, and a direction along a height).

For example, if the solid-state image pickup apparatus includes the insulating film 301, the light shielding film 303 at least partially covers the side surfaces of the gate electrodes 600 and 601 via the insulating film 301. In other words, the light shielding film 303 is provided over the gate electrodes 600 and 601 with the insulating film 301 interposed therebetween, and extends to the portion which is over the first semiconductor region 420 with the insulating film 301 interposed therebetween. It is desirable, from the viewpoint of the light shielding performance, that the end of the light shielding film 303 is located at the position closer to the substrate 100 than the upper end of the gate electrode 600 or 601 in the direction in parallel with the side surface of the gate electrode 600 or 601.

In other words, the light shielding film 303 is formed in such a manner that a distance between the end of the light shielding film 303 (for example, an end of the light shielding film 303 on the semiconductor layer of the photoelectric conversion unit 402) and the substrate 100 falls below a distance between the upper surface of the gate electrode 600 and the substrate 100. It is further desirable, from the viewpoint of the light shielding property, that the distance between the end of the light shielding film 303 (for example, the end of the light shielding film 303 on the photoelectric conversion unit 402) and the substrate 100 is half the distance between the upper surface of the gate electrode 600 and the substrate 100, or shorter than that. The distance between two members refers to a shortest distance between the two members.

The structures 813 and 814 are provided on the side surfaces of the gate electrodes 600 and 601, respectively, via the insulating film 701 below the light shielding film 303, which prevents or reduces the local thinning of the film thickness of the light shielding film 303 and the deterioration of the light shielding property due to this thinning. Therefore, it is desirable that the film thickness of the insulating film 701 in the direction perpendicular to the planar view is thinner than the film thickness of the gate electrode 600 or 601. Further, if the insulating film 301 is formed, it is desirable that a sum of the film thicknesses of the insulating film 701 and the insulating film 301 is thinner than the film thickness of the gate electrode 600 or the gate electrode 601.

Figure 2B:
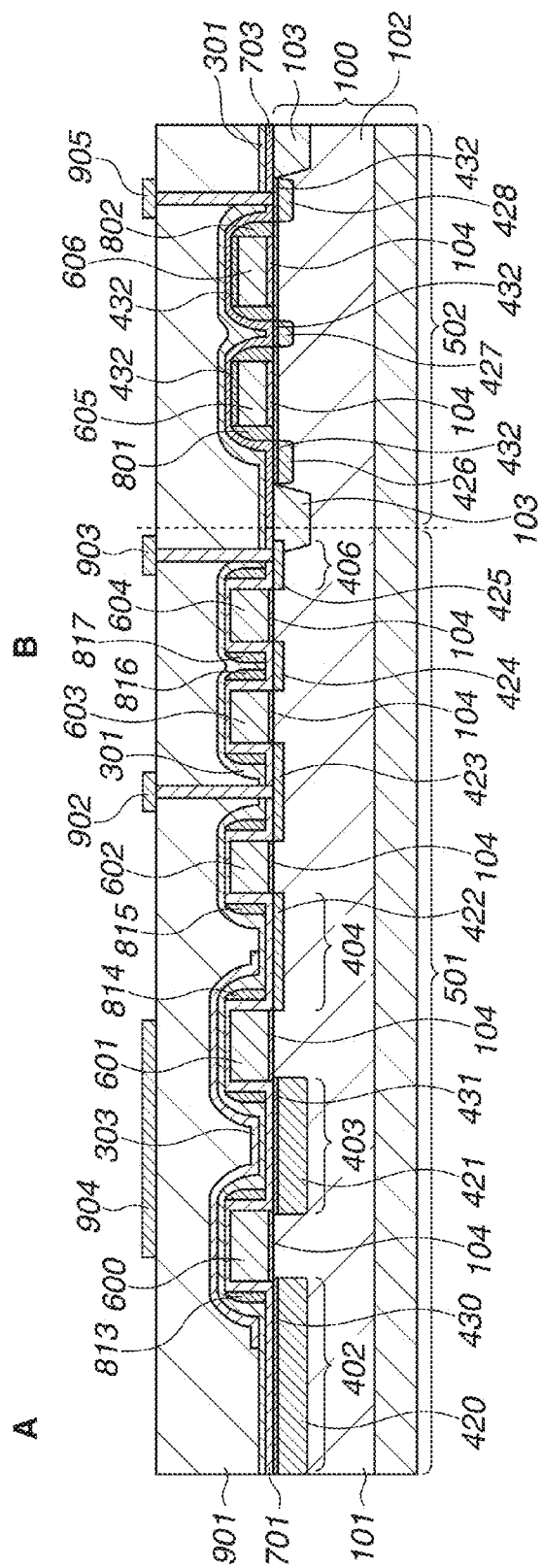
FIG. 2B is a schematic cross-sectional view of the part of the solid-state image pickup apparatus according to the first exemplary embodiment.

FIG. 2B illustrates a configuration including an interlayer insulating film 901 and conductive layers 902 to 904 formed on the light shielding film 303. In FIG. 2B, the interlayer insulating film 901 is provided on the light shielding film 303 of the pixel unit 501 and the insulating film 301 of the peripheral circuit unit 502. The conductive layer 902, which electrically connects the semiconductor region 423 and a power source circuit to each other, may be provided in a hole formed through the interlayer insulating film 901 and on the interlayer insulating film 901. Similarly, the conductive layer 903, which electrically connects the semiconductor region 425 and a signal output line to each other, may be provided in a hole formed through the interlayer insulating film 901 and on the interlayer insulating film 901.

Further, wiring 904 may be formed on the interlayer insulating film 901 on the pixel unit 501. Furthermore, similarly in the peripheral circuit unit 502, a wiring may be electrically connects the semiconductor region 432 by a conductive layer provided in a hole formed through the interlayer insulating film 901.

In the present exemplary embodiment, the structures 801, 802, and 813 to 817 are configured not to be provided on the gate electrodes 605, 606, and 600 to 604, respectively. The structure according to the present exemplary embodiment is not limited to this configuration, and may be configured in a different manner as long as the structure is configured to be able to prevent or reduce the local thinning of the film thickness of the light shielding film 303. Therefore, for example, the structures 801, 802, and 813 to 817 may even extend to the tops of the gate electrodes 605, 606, and 600 to 604 as long as the structures 801, 802, and 813 to 817 are each shaped so as to have such a curved surface shape that the center of curvature thereof is located on the one side that is closer to the corresponding gate electrode 605, 606, 600, 601, 602, 603, or 604 around the end of the gate electrode 605, 606, 600, 601, 602, 603, or 604.

A method for manufacturing the solid-state image pickup apparatus according to the present exemplary embodiment, like the example illustrated in FIG. 2A, will be described with reference to FIGS. 3A to 3D.

In the following description, an exemplary embodiment for embodying the present invention will be described with reference to the drawings.

The element separation portions 103 are formed on the substrate (the semiconductor substrate) 100 by the Shallow Trench Isolation method (the STI method) or the Local Oxidation of Silicon method (the LOCOS method). Then, the wells 101 and 102 are formed in the substrate 100 by the ion implantation method. Further, the N-type semiconductor region 420 and the P-type semiconductor region 430 of the photoelectric conversion unit 402, and the N-type semiconductor region 421 and the P-type semiconductor region 431 of the charge holding unit 403 are formed on the pixel unit 501 by the ion implantation method.

After that, the gate insulating film 104 is formed, and polysilicon is deposited thereon. Then, the gate electrodes 600, 601, 602, 603, 604, 605, and 606 are formed with use of the photolithography technique and the etching technique. Then, the N-type semiconductor regions 422, 423, 424, and 425 are formed by introducing an impurity into the substrate 100 by the ion implantation (FIG. 3A).

In the present example, the ion implantation for the charge holding unit 403 is carried out before the gate electrodes 600 to 606 are formed. However, the semiconductor regions 420, 421, 430, and 431 of the photoelectric conversion unit 402 and the charge holding unit 403 may be formed in a self-alignment manner by carrying out the ion implantation after forming the gate electrodes 600 to 606. For example, the semiconductor regions 420, 421, 430, and 431 of the photoelectric conversion unit 402 and the charge holding unit 403 can be formed in the self-alignment manner by carrying out the ion implantation with use of the gate electrodes 600 and 601 of the first and second transfer transistors 4 and 5 as a mask.

After that, the insulating film 701 is formed on the substrate 100 so as to cover the gate electrodes 600 to 606 with use of the chemical vapor deposition (CVD) method or the like. The structures 801 and 802, which function as the side wall spacers, are formed by applying a resist to the pixel unit 501 and etching the insulating film 701 only in the peripheral circuit unit 502.

The insulating film 701 can be used as the antireflection film for the pixel unit 501 by being made of, for example, the silicon nitride film, or the stack layer of the silicon oxide film and the silicon nitride film. In the present exemplary embodiment, the insulating film 701, which forms the structures 801 and 802 of the peripheral circuit unit 502, is left on the pixel unit 501 as the insulating film functioning as the protective film and the antireflection film for the semiconductor regions 420 to 425, 430, and 431. Therefore, the present exemplary embodiment can cut down the number of processes and cost compared to also etching the insulating film 701, which forms the structures 801 and 802, on the pixel unit 501 when forming the structures 801 and 802 of the peripheral circuit unit 502, and separately forming the protective film and the antireflection film for the pixel unit 501.

As illustrated in FIG. 3B, the sources and the drains of the transistors of the peripheral circuit unit 502 are formed in the self-alignment manner by carrying out the ion implantation in the peripheral circuit unit 502 with use of the structures 801 and 802 as the side wall spacers. Then, the insulating film 702 is formed on the pixel unit 501 and the peripheral circuit unit 502. The insulating film 702 can be made from, for example, the silicon oxide. After the insulating film 702 is formed, a resist is applied to the pixel unit 501, and the insulating film 702 is partially removed only in the peripheral circuit unit 502 by the dry etching.

The silicide layer 432 is formed in the exposed peripheral circuit unit 502 by forming and annealing a cobalt metallic film. At this time, the insulating film 702 on the pixel unit 501 functions as a protective film.

Immediately after the silicide layer 432 is formed, the insulating film 703 is deposited. The insulating film 703 is formed to prevent the diffusion of the silicide layer 432. A resist is applied to the peripheral circuit unit 502, while the insulating film 703 formed on the pixel unit 501 is removed by the etching. The insulating film 703 can be made of, for example, the film of silicon nitride, or the layer stack of the film of silicon oxide and the film of silicon nitride. At this time, the structures 813 to 817 are formed on the pixel unit 501 by also etching the insulating film 702 (FIG. 3C).

When the structures 813 to 817 are formed, the insulating film 702 is etched while a time period is adjusted by the dry etching so that the insulating film 701 remains on the semiconductor regions 420, 421, 430, and 431. The process of forming the structures 813 to 817 from the insulating film 702 may be performed at the same time as the etching of the insulating film 703, or may be performed separately from the etching of the insulating film 703 with use of a different etchant.

The insulating film 301 is deposited with use of the CVD method or the like, and is used as an adhesion layer when the light shielding film 303 is deposited. The insulating film 301 can be formed with use of, for example, the silicon oxide. The film having the light shielding property, such as a film made from at least any one of tungsten, tungsten silicide, and aluminum, is deposited thereon with use of the physical vapor deposition (PVD) method or the like. If it is desired to further increase adherability, a metallic film, such as titanium or titanium nitride, may be deposited on the insulating film 301.

The light shielding film 303 is formed by etching the film having the light shielding property to remove the portions thereof formed on the photoelectric conversion unit 402, the portion where the contact is formed, and the like (FIG. 3D). The film is etched so as to leave a portion of the film that covers the gate electrode 600 of the first transfer layer transistor 4, the charge holding unit 403, and the gate electrode 601 of the second transfer transistor 5.

The above-described method for manufacturing the solid-state image pickup apparatus includes providing the structures 813 and 814 on the side surfaces of the gate electrodes 600 and 601, respectively, thereby improving the coatability when the light shielding film 303 is formed thereon.

Further, the insulating film 701 is formed so as to cover the gate electrodes 600 and 601, the semiconductor regions 420 and 430 of the photoelectric conversion unit 402, and the semiconductor regions 421 and 431 of the charge holding unit 403 after the gate electrodes 600 and 601 are formed and before the structures 813 and 814 are formed. This arrangement can reduce the damage that might be inflicted on the semiconductor regions 420 and 430 of the photoelectric conversion unit 402 and the semiconductor regions 421 and 431 of the charge holding unit 403 when the insulating film 702 for forming the structures 813 and 814 is etched.

Furthermore, the light shielding film 303 is provided on the portion that is improved in flatness, and this improved flatness can also further effectively prevent or further greatly reduce a residue of the light shielding film 303 when the light shielding film 303 is removed by the etching, thereby preventing or reducing occurrence of a leak failure.

Figure 4:
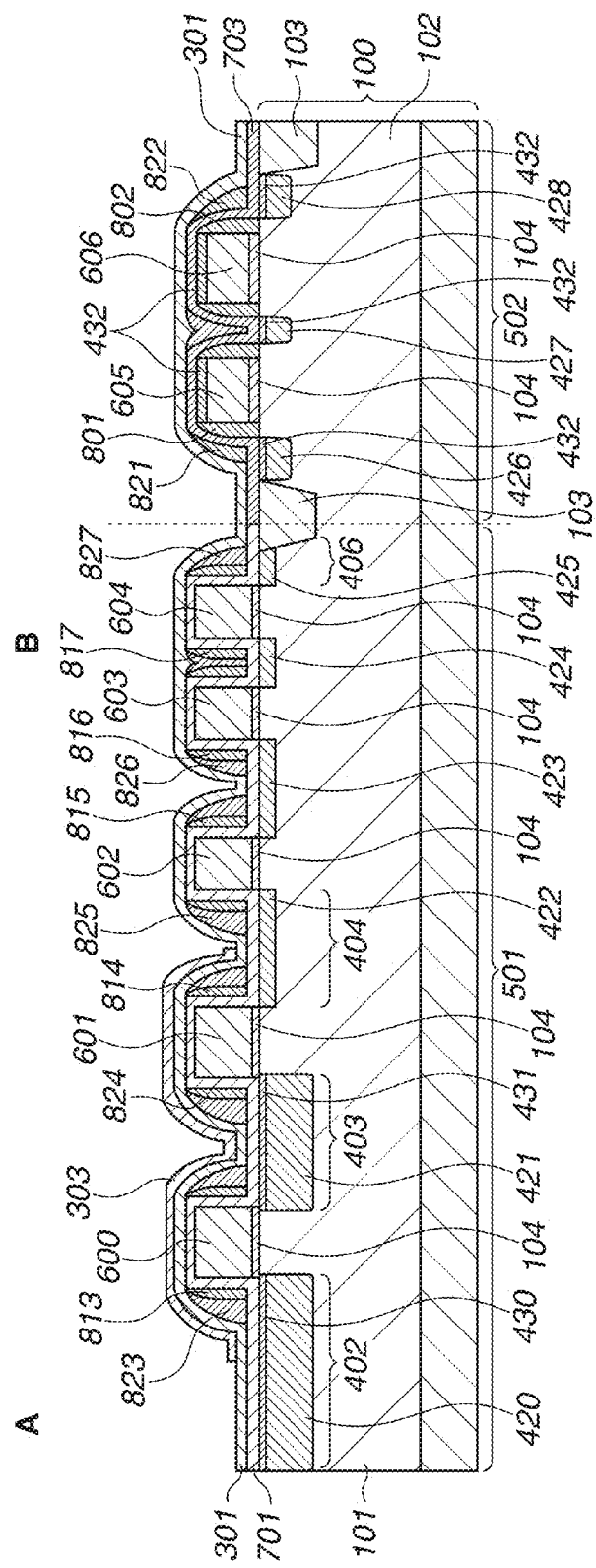
FIG. 4 is a schematic cross-sectional view of the part of the solid-state image pickup apparatus according to the second exemplary embodiment.

FIG. 4 is a schematic cross-sectional view of a part of a solid-state image pickup apparatus according to a second exemplary embodiment, which is another exemplary embodiment than the first exemplary embodiment. The second exemplary embodiment will be described below, omitting descriptions of similar portions to the first exemplary embodiment and mainly focusing on differences from the first exemplary embodiment.

On the pixel unit 501, the structures 813 to 817 are formed on the side surfaces of the gate electrodes 600 to 604 in the first exemplary embodiment (FIG. 2B), respectively, via the insulating film 701, and structures 823 to 827 are further provided on side surfaces of the structures 813 to 817, respectively. The structures 823 to 827 are each configured in such a manner that at least a side surface of an upper portion thereof is a curved surface, and a center of curvature of the curved surface is located on one side that is closer to the corresponding gate electrode 600, 601, 602, 603, or 604. The structures 823 to 827 each include, for example, silicon oxide as a main component thereof.

In the solid-state image pickup apparatus according to the present exemplary embodiment, the structure 801 is provided, and a structure 821 is provided via the insulating film 703, on the side surface of the gate electrode 605 in the first exemplary embodiment (FIG. 2B). Further, the structure 802 is provided, and a structure 822 is provided via the insulating film 703, on the side surface of the gate electrode 606. An upper portion of each of the structures 821 and 822 has a side surface shaped as a curved surface having a center of curvature on one side that is closer to the gate electrode 605 or 606 corresponding to each of them. The structures 801 and 802 each include, for example, silicon oxide as a main component thereof.

The insulating film 301 is formed on the substrate 100 so as to cover the insulating film 701, the structures 823 to 827, and the structures 821 and 822.

The light shielding film 303 is formed on the insulating film 301 so as to cover the gate electrode 600 of the first transfer transistor 4, the semiconductor regions 421 and 431 of the charge holding unit 403, and the gate electrode 601 of the second transfer transistor 5.

In this manner, the present exemplary embodiment is further provided with the structures 823 to 827, 821 and 822 each configured in such a manner that at least the side surface of the upper portion thereof is shaped as the curved surface having the center of curvature on the one side that is closer to the corresponding gate electrode 600, 601, 602, 603, 604, 605, or 606, which can make the gentler differences in level between the structures 813 and 814 and the substrate 100 on the region where the light shielding film 303 is formed. Therefore, this provision can further effectively prevent or further greatly reduce the local thinning of the film thickness of the light shielding film 303, thereby further effectively preventing or further greatly reducing the deterioration of the light shielding performance due to the thinning of the film thickness of the light shielding film 303.

A method for manufacturing the solid-state image pickup apparatus according to the second exemplary embodiment illustrated in FIG. 4 will be described with reference to FIGS. 5A to 5E.

Figure 5A:
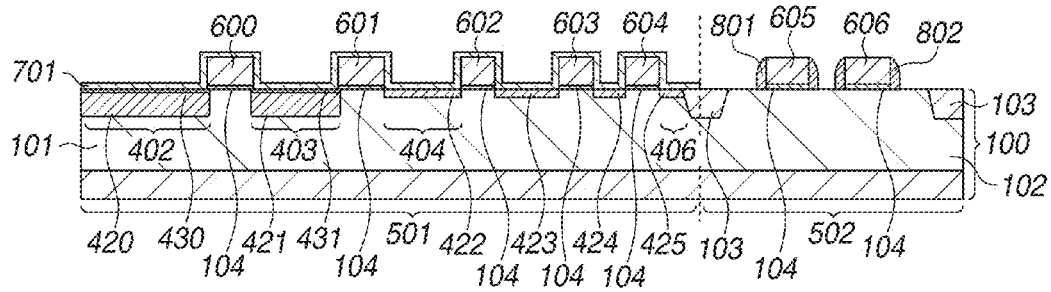
FIGS. 5A, 5B, 5C, 5D, and 5E are schematic cross-sectional views of the part of the solid-state image pickup apparatus according to the second exemplary embodiment.
Figure 5B:
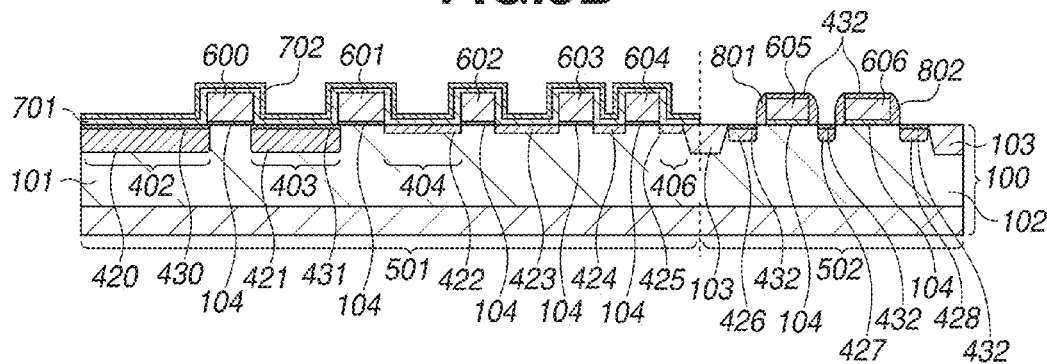
Figure 5C:
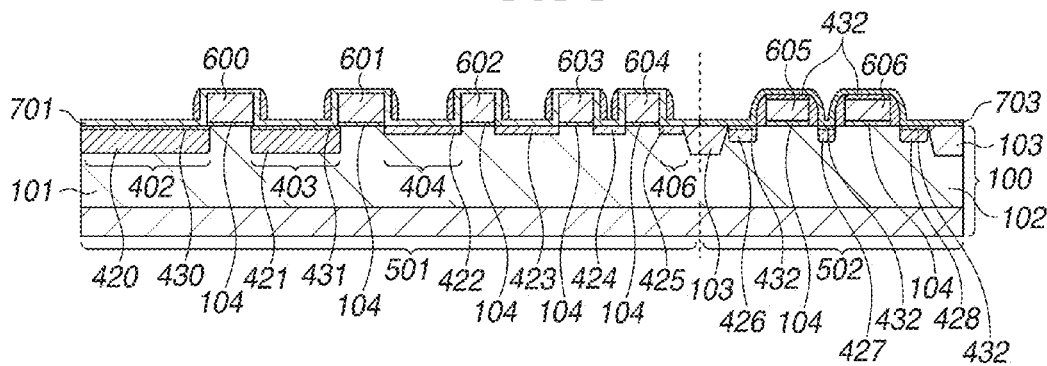

The method therefor for FIGS. 5A to 5C is similar to the first exemplary embodiment (FIGS. 3A to 3C).

Figure 5D:
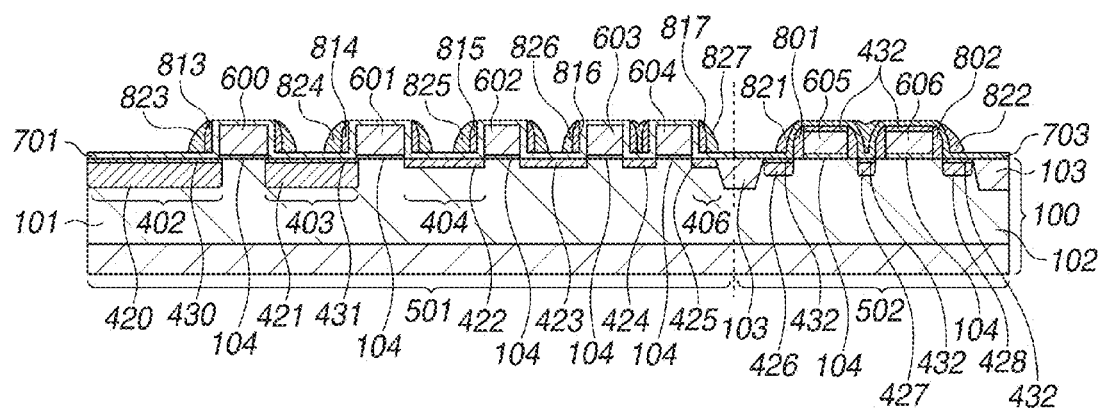

An insulating film is formed, and the insulating film on both the pixel unit 501 and the peripheral circuit unit 502 is etched back. Then, the structures 823 to 827, and the structures 821 and 822 are further formed on the structures 813 to 817, and the structures 801 and 802, respectively (FIG. 5D). The structures 823 to 827, and the structures 821 and 822 can be formed with use of a similar material and method to the structures 813 to 817, and the structures 801 and 802.

After that, the insulating film 301 is deposited with use of the CVD method or the like, and is used as the adhesion layer when the light shielding film 303 is deposited. The film having the light shielding property, such as the film made from at least any one of the tungsten, the tungsten silicide, and the aluminum, is deposited thereon with use of the PVD method or the like. If it is desired to further increase the adherability, the metallic film, such as the titanium or the titanium nitride, may be deposited on the insulating film 301.

Figure 5E:
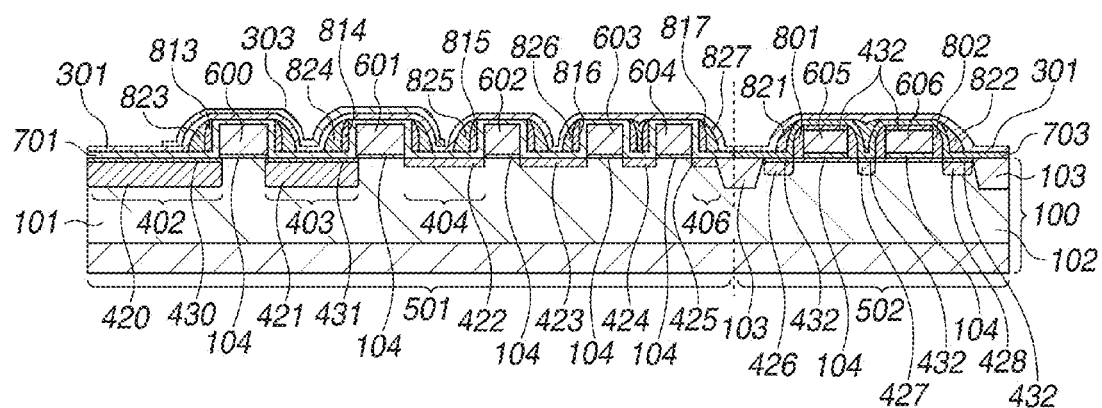

The light shielding film 303 is formed by removing the portions of this film formed on the photoelectric conversion unit 402, the portion where the contact is formed, and the like by the etching (FIG. 5E). The film is etched so as to leave the portion of the film having the light shielding property that covers the gate electrode 600 of the first transfer layer transistor 4, the charge holding unit 403, and the gate electrode 601 of the second transfer transistor 5.

A plurality of structures is formed on the side surface of the gate electrode in this manner, by which the light shielding film 303 can be formed thereon with further improved coatability.

Further, the insulating film 701 is formed so as to cover the gate electrodes 600 and 601, the semiconductor regions 420 and 430 of the photoelectric conversion unit 402, and the semiconductor regions 421 and 431 of the charge holding unit 403 after the gate electrodes 600 and 601 are formed and before the structures 813 and 814 are formed. This arrangement can reduce the damage that might be inflicted on the semiconductor regions 420 and 430 of the photoelectric conversion unit 402 and the semiconductor regions 421 and 431 of the charge holding unit 403, when the insulating film 702 for forming the structures 813 and 814 is etched.

Furthermore, the light shielding film 303 is provided on the portion that is improved in flatness, and this improved flatness can also further effectively prevent or further greatly reduce the residue of the light shielding film 303 when the light shielding film 303 is removed by the etching, thereby preventing or reducing the occurrence of a leak failure.

Figure 6:
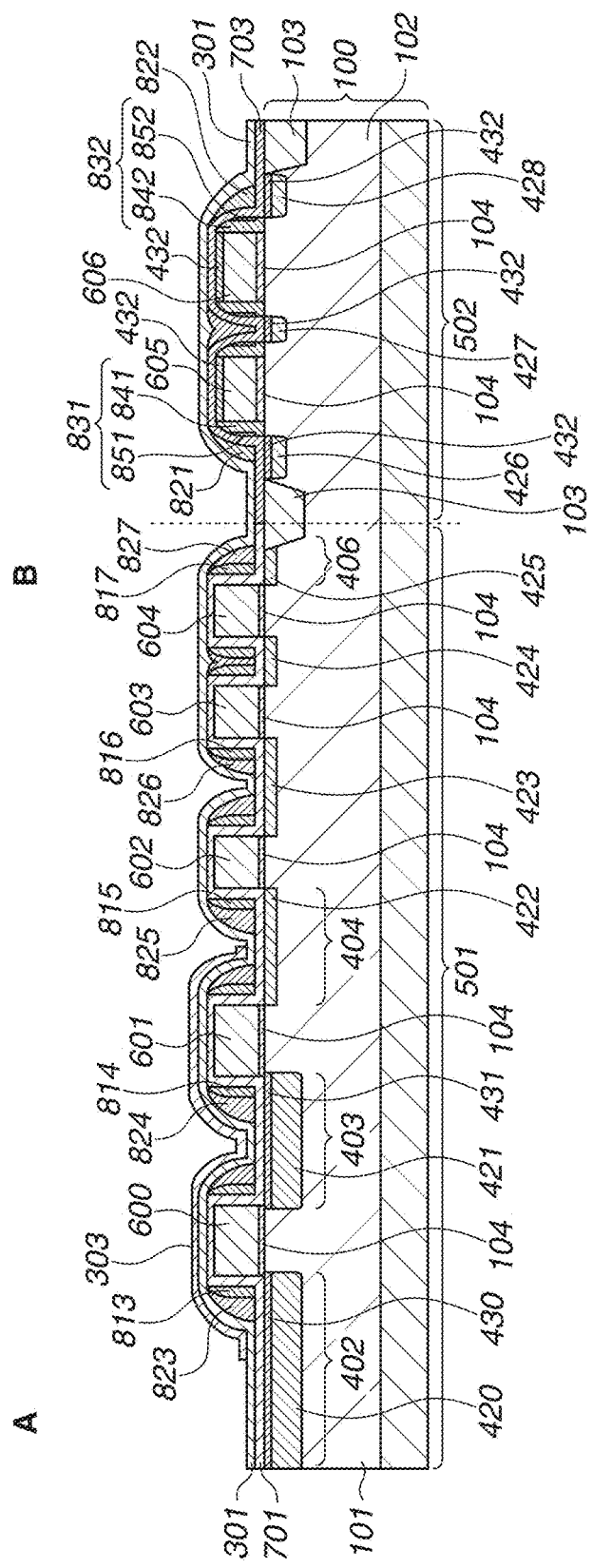
FIG. 6 is a schematic cross-sectional view of the part of the solid-state image pickup apparatus according to the third exemplary embodiment.

FIG. 6 is a schematic cross-sectional view of a part of a solid-state image pickup apparatus according to a third exemplary embodiment, which is another exemplary embodiment than the first and second exemplary embodiments. The third exemplary embodiment will be described below, omitting descriptions of similar portions to the first or second exemplary embodiment and mainly focusing on differences from the first or second exemplary embodiment.

In the present third exemplary embodiment, structures 831 and 832 provided on the sidewalls of the gate electrodes 605 and 606 disposed in the peripheral circuit unit 502 in the first exemplary embodiment (FIG. 2B) are not formed only from the insulating film 701 but are formed from the insulating film 701 and the insulating film 702. An upper portion of each of the structures 831 and 832 has a side surface shaped as a curved surface having a center of curvature on one side that is closer to the gate electrode 605 or 606 corresponding to each of them.

The structures 831 and 832 according to the present exemplary embodiment include structures 841 and 842 each containing, for example, silicon nitride as a main component thereof that are provided on the side surfaces of the gate electrodes 605 and 606, and structures 851 and 852 each containing, for example, silicon oxide as a main component thereof that are provided on side surfaces of the structures 841 and 842, respectively. Alternatively, if the insulating film 701 is the layer stack of the silicon oxide and the silicon nitride, this results in the structures 831 and 832 including the structures 841 and 842 each containing the two layers, the silicon oxide film and the silicon nitride film, and the structures 851 and 852 each containing the silicon oxide, from the side surfaces of the gate electrodes 605 and 606, respectively.

Further, the structures 823 to 827 are further provided on the side surfaces of the structures 813 to 817 of the pixel unit 501, respectively. The structures 823 to 827 are each configured in such a manner that at least the side surface of the upper portion thereof is shaped as the curved surface having the center of curvature on the one side that is closer to the corresponding gate electrode 600, 601, 602, 603, or 604.

The insulating film 703 is provided on the substrate 100 so as to cover the structures 831 and 832 in the peripheral circuit unit 502, and the structures 821 and 822 are provided on the side surfaces of the structures 831 and 832, respectively, via the insulating film 703.

A method for manufacturing the solid-state image pickup apparatus according to the present third exemplary embodiment, like the example illustrated in FIG. 6, will be described with reference to FIGS. 7A to 7E.

In the following description, an exemplary embodiment for embodying the present invention will be described with reference to the drawings.

The element separation portions 103 are formed on the substrate 100, which is the semiconductor substrate, by the STI method or the LOCOS method. The wells 101 and 102 are formed by the ion implantation method. Then, the N-type semiconductor region 420 and the P-type semiconductor region 430 of the photoelectric conversion unit 402, and the N-type semiconductor region 421 and the P-type semiconductor region 431 of the charge holding unit 403 are formed on the pixel unit 501 by the ion implantation method.

Figure 7A:
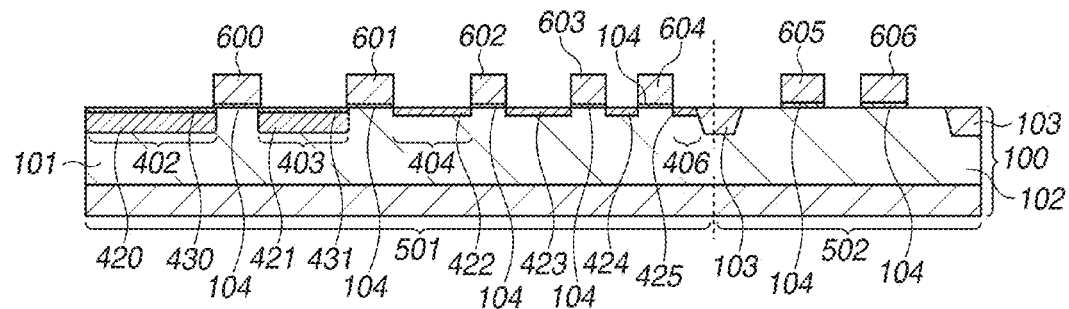
FIGS. 7A, 7B, 7C, 7D, and 7E are schematic cross-sectional views of the part of the solid-state image pickup apparatus according to the third exemplary embodiment.

After that, the gate insulating film 104 is formed, and the polysilicon is deposited thereon. Then, the gate electrodes 600, 601, 602, 603, 604, 605, and 606 are formed with use of the photolithography technique and the etching technique. After that, the N-type semiconductor regions 422, 423, 424, and 425 are formed by the ion implantation (FIG. 7A).

In the present example, the ion implantation for the photoelectric conversion unit 402 and the charge holding unit 403 is carried out before the gate electrodes 600 to 606 are formed. However, the photoelectric conversion unit 402 and the charge holding unit 403 can also be formed in the self-alignment manner by carrying out the ion implantation for the photoelectric conversion unit 402 and the charge holding unit 403 after forming the gate electrodes 600 to 606, and using the gate electrodes 600 and 601 of the first and second transfer transistors 4 and 5.

Figure 7B:
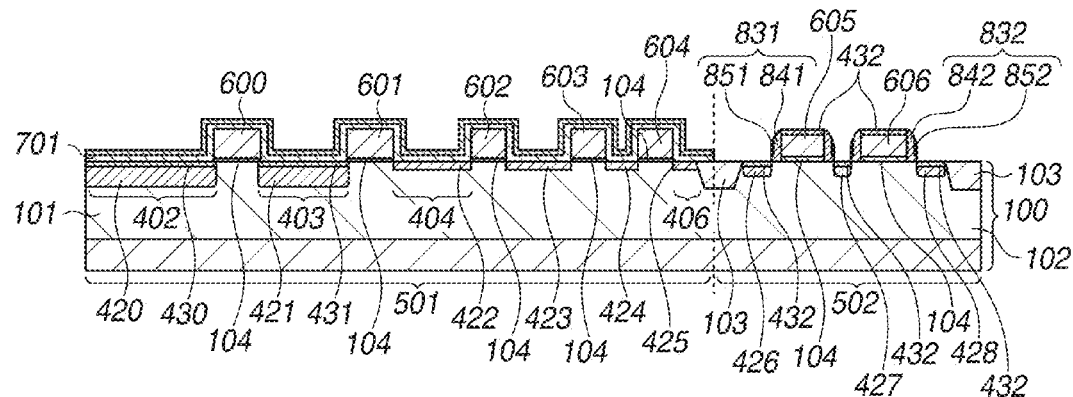

After that, as illustrated in FIG. 7B, the insulating film 701 and the insulating film 702 are formed on the gate electrodes 600 to 606 with use of the CVD method or the like. The structures 831 and 832 are formed by applying a resist to the pixel unit 501 and partially removing the insulating film 701 and the insulating film 702 only on the peripheral circuit unit 502 by the dry etching. The structure 831 includes the structure 841 formed from the insulating film 701 and the structure 851 formed from the insulating film 702. Further, structure 832 includes the structure 842 formed from the insulating film 701 and the structure 852 formed from the insulating film 702.

The sources and the drains of the transistors of the peripheral circuit unit 502 are formed in the self-alignment manner by carrying out the ion implantation on the peripheral circuit unit 502 with use of the gate electrodes 605 and 606 and the first and second structures 831 and 832 as a mask. The insulating film 701 functions as the antireflection film for the pixel unit 501 by being made of, for example, the silicon nitride film or the stack layer of the silicon oxide film and the silicon nitride film.

In the present exemplary embodiment, the insulating film 701, which forms the structures 841 and 842 of the peripheral circuit unit 502, is left on the pixel unit 501 as the insulating film functioning as the protective film and the antireflection film for the semiconductor regions 420 to 425, 430, and 431. Therefore, the present exemplary embodiment can cut down the number of processes and the cost compared to also etching the insulating film 701, which forms the structures 841 and 842, on the pixel unit 501 when forming the structures 841 and 842 of the peripheral circuit unit 502, and separately forming the protective film and the antireflection film for the pixel unit 501.

The silicide layer 432 is formed in the exposed peripheral circuit unit 502 by forming and annealing the cobalt metallic film, similarly to the first and second exemplary embodiments. At this time, the insulating film 702 functions as the protective film when the silicide layer 432 is formed in the peripheral circuit unit 502.

Figure 7C:
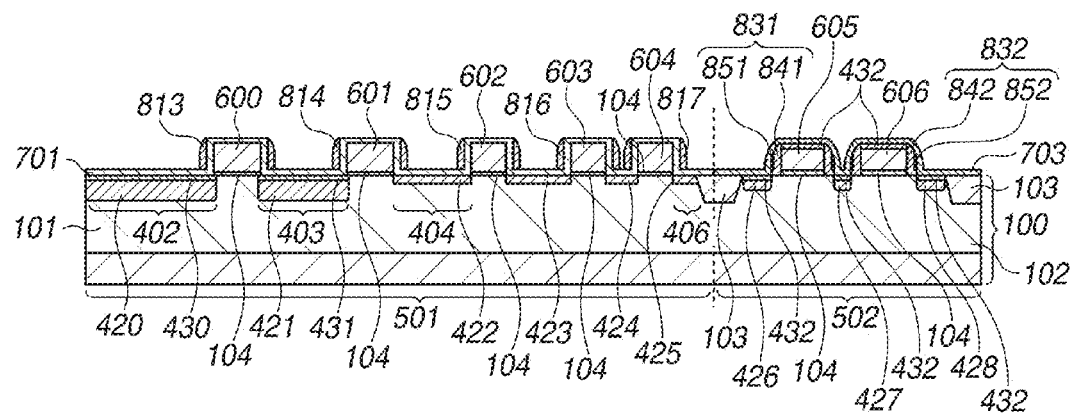

Immediately after the silicide layer 432 is formed, the insulating film 703 is formed. This insulating film 703 is formed to prevent the diffusion of the silicide layer 432. The resist is applied onto the insulating film 703 on the peripheral circuit unit 502, while the insulating film 703 is removed on the pixel unit 501 by the etching. At this time, the structures 813 to 817 are formed on the pixel unit 501 by also etching the insulating film 702 simultaneously (FIG. 7C).

Figure 7D:
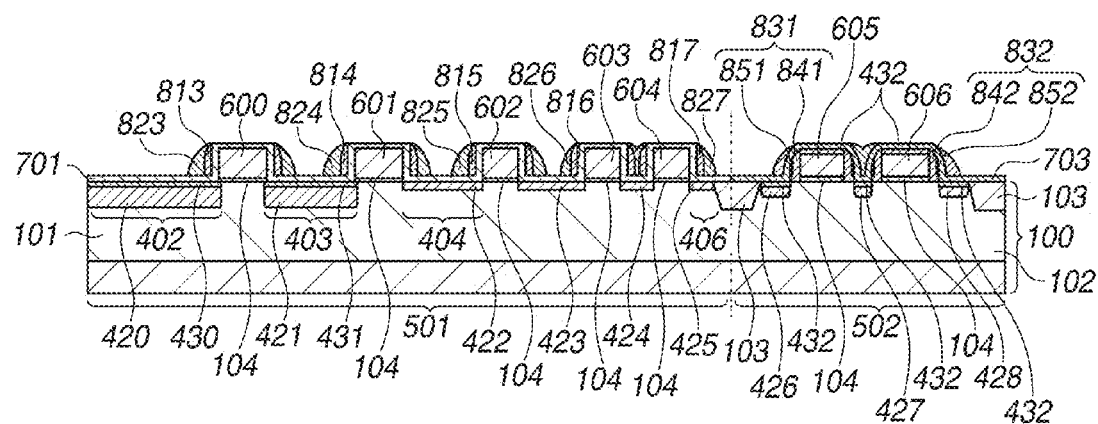

The structures 823 to 827, and the structures 821 and 822 are further formed on the side surfaces of the structures 813 to 817, and the structures 831 and 832, respectively, by forming the insulating film and etching back the insulating film on both the pixel unit 501 and the peripheral circuit unit 502 (FIG. 7D).

Figure 7E:
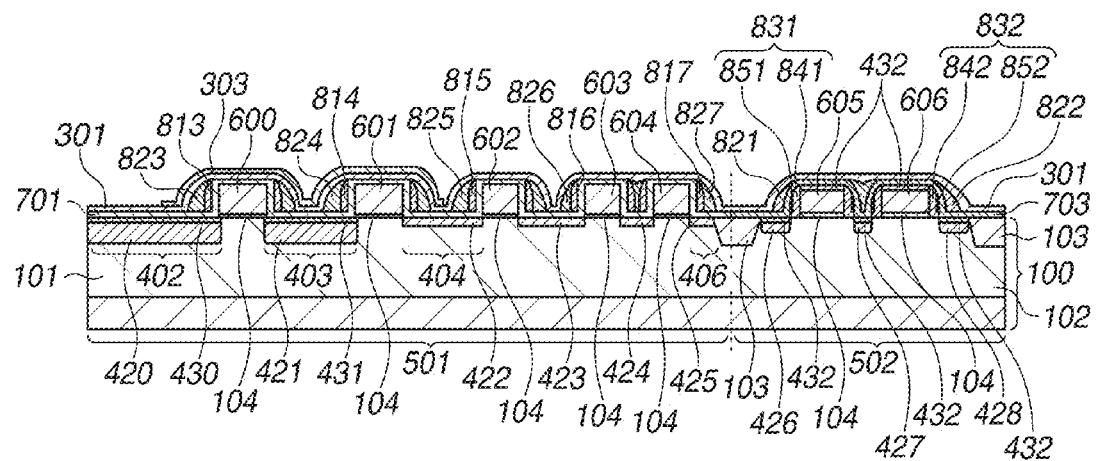

As illustrated in FIG. 7E, the insulating film 301 is deposited with use of the CVD method or the like, and the light shielding film 303 is formed thereon with use of the deposited insulating film 301 as the adhesion layer when the light shielding film 303 is formed.

The light shielding film 303 is formed in the following manner. The film having the light shielding property, such as the film made from at least any one of the tungsten, the tungsten silicide, and the aluminum, is deposited on the insulating film 301 with use of the PVD method or the like. If it is desired to further increase the adherability, the metallic film, such as the titanium or the titanium nitride, may be deposited on the insulating film 301. The light shielding film 303 is formed by removing the portions of this film deposited on the photoelectric conversion unit 402, the portion where the contact is formed, and the like by the etching (FIG. 7E). The film is etched so as to leave the portion of the film that covers the gate electrode 600 of the first transfer layer transistor 4, the charge holding unit 403, and the gate electrode 601 of the second transfer transistor 5.

The structures 813 and 814 and the structures 823 and 824 are formed on the side surfaces of the gate electrodes 600 and 601, by which the coatability is improved when the light shielding film 303 is formed thereon. Providing the structures 823 and 824 in addition to the structures 813 and 814 suppresses the undulation of the surface of the target to be covered with the light shielding film 303 that faces the light shielding film 303 (in the present example, surfaces defined by connecting the upper surfaces of the gate electrodes 600 and 601 and side surfaces of the structures 823 and 824, respectively). Therefore, this provision can further effectively prevent or further greatly reduce the thinning of the film thickness of the light shielding film 303, thereby further improving the coatability of the covering by the light shielding film 303.

In other words, a plurality of structures is formed on the side surface of the gate electrode in this manner, by which the light shielding film 303 can be formed thereon with further improved coatability.

Further, the insulating film 701 is formed so as to cover the gate electrodes 600 and 601, the semiconductor regions 420 and 430 of the photoelectric conversion unit 402, and the semiconductor regions 421 and 431 of the charge holding unit 403 after the gate electrodes 600 and 601 are formed and before the structures 813 and 814 are formed. This arrangement can reduce the damage that might be inflicted on the semiconductor regions 420 and 430 of the photoelectric conversion unit 402 and the semiconductor regions 421 and 431 of the charge holding unit 403 when the insulating film 702 for forming the structures 813 and 814 is etched.

Furthermore, the light shielding film 303 is provided on the portion that is improved in flatness, and this improved flatness can also prevent or reduce the residue of the light shielding film 303 when the light shielding film 303 is removed by the etching, thereby preventing or reducing the occurrence of a leak failure.

Figure 8:
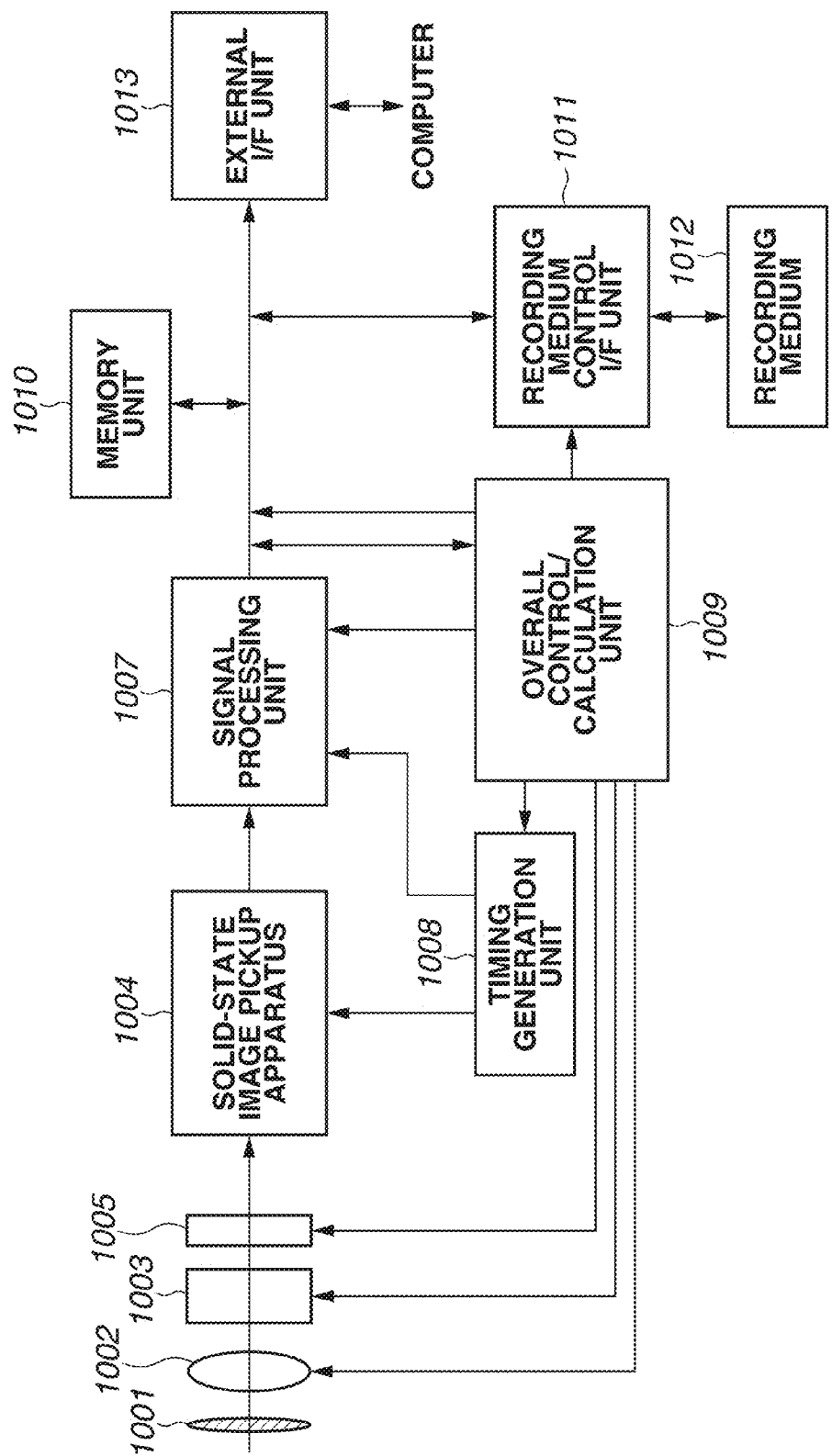
FIG. 8 is a block diagram of one example of an image pickup system according to a fourth exemplary embodiment.

An image pickup system according to a fourth exemplary embodiment of the present invention will be described. Examples of the image pickup system include a digital still camera, a video camera, a digital camcorder, a copying machine, a facsimile, a mobile phone, a car-mounted camera, an observation satellite, and the like. FIG. 8 illustrates a block diagram of a digital still camera as an example of the image pickup system according to the fourth exemplary embodiment.

In FIG. 8, the image pickup system includes a barrier 1001 for protecting a lens, a lens 1002 that forms an optical image of an object on a solid-state image pickup apparatus 1004, a diaphragm 1003 for making variable an amount of light transmitted through the lens 1002, and a mechanical shutter 1005. The image pickup system further includes the solid-state image pickup apparatus 1004 described in any of the above-described first to third exemplary embodiments, and the solid-state image pickup apparatus 1004 converts the optical image formed by the lens 1002 as image data. In the present example, assume that an analog-to-digital (AD) conversion unit is formed on the semiconductor substrate 100 of the solid-state image pickup apparatus 1004.

The image pickup system further includes a signal processing unit 1007, a timing generation unit 1008, an overall control/calculation unit 1009, a memory unit 1010, a recording medium control interface (I/F) unit 1011, a recording medium 1012, and an external I/F unit 1013. The signal processing unit 1007 carries out various kinds of corrections and compression of data on the captured image data output from the solid-state image pickup apparatus 1004. The timing generation unit 1008 outputs various kinds of timing signals to the solid-state image pickup apparatus 1004 and the signal processing unit 1007.

The overall control/calculation unit 1009 controls the entire digital still camera, and the memory unit 1010 functions as a frame memory to temporarily store the image data. The recording medium control I/F unit 1011 records or reads data into or out of the recording medium 1012. The recording medium 1012 is embodied by a detachably mounted semiconductor memory or the like, and the captured image data is recorded into or read out of the recording medium 1012. The external I/F unit 1013 is an interface for communicating with an external computer and the like.

The timing signal and the like may be input from outside the image pickup system, and the image pickup system may be configured in a different manner as long as the image pickup system includes at least the solid-state image pickup apparatus 1004, and the signal processing unit 1007 that processes a captured image signal output from the solid-state image pickup apparatus 1004.

The above-described exemplary embodiments merely indicate specific examples when the present invention is embodied, and the technical range of the present invention shall not be construed limitedly by these exemplary embodiments. In other words, the present invention can be embodied in various manners without departing from the technical idea of the present invention.

For example, the present invention can be used for not only the difference in level due to the gate electrode of the transistor, but also a solid-state image pickup apparatus having a configuration that may lead to a difference in level due to a member located below the light shielding film with respect to a light shielding unit. Further, the above-described exemplary embodiments have been described, by way of example, referring to the solid-state image pickup apparatus that handles electrons as a signal charge, but the present invention can also be applied in a similar manner even to a solid-state image pickup apparatus that handles holes as the signal charge. In this case, the above-described conductivity types of the semiconductor regions are each changed to the opposite type, i.e., from P type to N type and from N type to P type.

Further, the planar layout of the pixel circuit of the solid-state image pickup apparatus illustrated in FIG. 1B indicates merely one example, and the planar layout of the pixel circuit of the solid-state image pickup apparatus to which the present invention is applicable is not limited thereto.

Furthermore, the method of manufacturing the solid-state image pickup apparatus disclosed in the specification includes the followings. The method for manufacturing a solid-state image pickup apparatus, the method comprising forming a first semiconductor region of a photoelectric conversion unit and a second semiconductor region of a charge holding unit in a substrate, forming a first gate electrode of a first transistor configured to transfer a charge in the first semiconductor region to the charge holding unit and a second gate electrode of a second transistor configured to transfer the charge from the second semiconductor region, on the substrate, forming a first insulating film over the substrate after forming the first gate electrode and the second gate electrode, forming a second insulating film on the first insulating film, forming a first structure on a first side surface of the first gate electrode so that the first insulating film is between the first gate electrode and the first structure, by etching the second insulating film while the first insulating film remains on the first semiconductor region and the second semiconductor region, the first side surface of the first gate electrode being on a side where the photoelectric conversion unit is provided, and a second side surface of the first gate electrode being on a side where the charge holding unit is provided, and forming a light shielding film along the first structure, on a region which extends from a region over the first gate electrode to a region over the first semiconductor region by forming a film after forming the first structure, and by etching a part of the film, wherein a cross-sectional shape of a top part of the first structure in a first direction from the photoelectric conversion unit to the charge holding unit has a surface where a distance between the surface of the top part and the first side surface of the first gate electrode decreases in a second direction from a bottom of the first structure to a top of the first structure, and wherein a distance between the first semiconductor region and an end of the light shielding film that is over the first semiconductor region is smaller than a distance between a top surface of the first gate electrode and the substrate.

The above method for manufacturing the solid-state image pickup apparatus further comprises forming a third insulating film that covers the photoelectric conversion unit, the first transistor, the charge holding unit, and the second transistor after forming the first structure and before forming the film, wherein the film is formed immediately after forming the third insulating film.

In the above method for manufacturing the solid-state image pickup apparatus, the surface of the top part of the first structure is a curved surface.

In the above method for manufacturing the solid-state image pickup apparatus, further comprises forming a third structure on a side surface of a third gate electrode of a third transistor of a peripheral circuit unit by etching the first insulating film in the peripheral circuit unit before forming the second insulating film.

The cross-sectional shape of a top part of the third structure in a channel length direction of the third transistor has a surface where a distance between a side surface of the top part of the third structure and a side surface of the third gate electrode decreases in a sixth direction from a bottom of the third structure to a top of the third structure.

In the above method for manufacturing the solid-state image pickup apparatus, further comprises introducing an impurity into the substrate in the peripheral circuit unit with use of the third gate electrode and the third structure as a mask after forming the third structure and before forming the second insulating film.

In the above method for manufacturing the solid-state image pickup apparatus, further comprises forming a silicide layer in the peripheral circuit unit and forming a fourth insulating film immediately after forming the silicide layer, after forming the second insulating film and before forming the first structure.

In the above method for manufacturing the solid-state image pickup apparatus, further comprises forming a fourth structure and a fifth structure on the side surfaces of the first structure and the third structure, respectively, by forming a fifth insulating film on the substrate and etching the fifth insulating film, after forming the first structure and before forming the film.

In the above method for manufacturing the solid-state image pickup apparatus, the fifth structure is formed on the side surface of the third structure with the fourth insulating film interposed between the third structure and the fifth structure, in the peripheral circuit unit.

In the above method for manufacturing the solid-state image pickup apparatus, the etching of the first and second insulating film for forming the first, second and third structures is dry etching.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A solid-state image pickup apparatus comprising:
   a photoelectric conversion unit including a first semiconductor region which is provided in a substrate;
   a first transistor provided on the substrate;
   a first insulating film covering a top surface and a side surface of a first gate electrode of the first transistor and including silicon nitride;
   a first structure provided on the side surface of the first gate electrode with the first insulating film interposed between the first gate electrode and the first structure;
   an interlayer insulating film provided over the first insulating film and the first structure;
   a conductive layer electrically connected to the first transistor through a hole in the interlayer insulating film; and
   a light shielding film provided between the first insulating film and the interlayer insulating film,
   wherein in a cross-sectional view including the first insulating film and the interlayer insulating film, the first structure has a round surface on an opposite side to the first gate electrode.

2. The solid-state image pickup apparatus according to claim 1, further comprising a charge holding unit including a second semiconductor region which is provided in the substrate.

3. The solid-state image pickup apparatus according to claim 1, wherein that the first transistor configured to transfer a charge in the first semiconductor region.

4. The solid-state image pickup apparatus according to claim 3, further comprising a second transistor configured to transfer the charge in the second semiconductor region,
   wherein the first insulating film is continuous from a region which is over a top surface of the first gate electrode to a region which is over a top surface of the second gate electrode of the second transistor.

5. The solid-state image pickup apparatus according to claim 4, further comprising:
   a second structure provided on a side surface of the second gate electrode with the first insulating film interposed between the second gate electrode and the second structure
   wherein in a cross-sectional view including the first insulating film and the interlayer insulating film, the second structure has a round surface on an opposite side to the second gate electrode.

6. The solid-state image pickup apparatus according to claim 4, wherein the light shielding film extends from a region over the first gate electrode to a region over the second gate electrode with the first insulating film interposed between the first gate electrode and the light shielding film and between the second gate electrode and the light shielding film.

7. The solid-state image pickup apparatus according to claim 1, further comprising a peripheral circuit unit including
   a third transistor including a third gate electrode, and
   a third structure provided in contact with a side surface of the third gate electrode.

8. The solid-state image pickup apparatus according to claim 7, further comprising a second insulating film on the third structure, the second insulating film covering the third transistor.

9. The solid-state image pickup apparatus according to claim 1, wherein the first structure and the first insulating film include different main components from each other.

10. The solid-state image pickup apparatus according to claim 1, wherein the first structure includes silicon oxide.

11. The solid-state image pickup apparatus according to claim 1, wherein the first insulating film covers a top surface of the photoelectric conversion unit.

12. The solid-state image pickup apparatus according to claim 1, wherein an end of the light shielding film is located on the photoelectric conversion unit with the first insulating film interposed between the photoelectric conversion unit and the light shielding film.

13. An image pickup system comprising;
   a solid-state image pickup apparatus according to claim 1; and
   a signal processing unit configured to process an output from the solid-state image pickup apparatus.

* * * * *